(12) United States Patent
Kim

(10) Patent No.: US 6,750,121 B1
(45) Date of Patent: Jun. 15, 2004

(54) APPARATUS AND METHOD FOR FORMING SINGLE CRYSTALLINE NITRIDE SUBSTRATE USING HYDRIDE VAPOR PHASE EPITAXY AND LASER BEAM

(75) Inventor: Bong-Cheol Kim, Cheongiu-shi (KR)

(73) Assignee: Protech Inc. (KR)

( * ) Notice: Subject to any disclaimer, the term of this patent is extended or adjusted under 35 U.S.C. 154(b) by 0 days.

(21) Appl. No.: 10/089,479

(22) PCT Filed: Aug. 21, 2000

(86) PCT No.: PCT/KR00/00935
§ 371 (c)(1),
(2), (4) Date: Mar. 28, 2002

(87) PCT Pub. No.: WO01/23648
PCT Pub. Date: Apr. 5, 2001

(30) Foreign Application Priority Data

Sep. 30, 1999 (KR) ........................ 1999-41892

(51) Int. Cl.$^7$ ..................... H01L 21/20; H01L 21/36
(52) U.S. Cl. .............. 438/488; 438/489; 438/681; 438/535
(58) Field of Search ................ 438/482, 483, 438/485, 486, 487, 488, 489, 491, 502, 535, 680, 681, 775, 776, 778, 792, 795, 908

(56) References Cited

U.S. PATENT DOCUMENTS 5,938,839 A * 8/1999 Zhang ................. 117/104
6,218,207 B1 * 4/2001 Itoh et al. .............. 438/46

FOREIGN PATENT DOCUMENTS

| JP | 61179523 | 12/1986 |
| JP | 03022410 | 1/1991 |
| JP | 9116638 | 4/2002 |

OTHER PUBLICATIONS

Appplied Physics Letters, Feb. 1998, Japan, Kelly et al.*

University of CA Berkeley, Feb. 1998, USA, Wong et al.*

"Optical Process for Liftoff of Group III–Nitride Films", by Kelly et al., phys. stat. sot. (a) 159, R3 (1997).

"Damage–free Separation of GaN Thin Films From Sapphire Substrates", by Wong et al., *Applied Physics Letters*, vol. 72, No. 5, Feb. 2, 1998, pp. 599–601.

"Fabrication of Thin–Film InGaN Light–emitting Diode Membranes by Laser Lift–off", by Wong et al., *Applied Physics Letters*, vol. 75, No. 10, Sep. 6, 1999, pp. 1360–1362.

"Large Free–Standing GaN Substrates by Hydride Vapor Phase Epitaxy and Laser–Induced Liftoff", by Kelly et al., *Jpn, J. Appl. Phys.*, vol. 38 (1999) pp. L217–L219.

(List continued on next page.)

Primary Examiner—David Nhu
(74) Attorney, Agent, or Firm—Baker Botts LLP

(57) ABSTRACT

The present invention relates to an apparatus and a method for forming a single crystalline nitride substrate, and more particularly, to an apparatus and a method for preventing cracks from being generated in a single crystalline nitride substrate. A method for forming a compound semiconductor substrate includes the steps of: a) preparing a parent substrate; b) forming a single crystalline film on the parent substrate in a reacting chamber; c) maintaining the single crystalline film in a predetermined temperature which is higher than a room temperature; and d) illuminating laser beam on a backside of the parent substrate and separating the single crystalline film from the parent substrate. Accordingly, the present invention provides a large single crystalline nitride substrate, by preventing cracks caused by the lattice mismatch with the parent substrate.

6 Claims, 3 Drawing Sheets

OTHER PUBLICATIONS

"Technical Specification Group Services and Systems Aspects: Architecture of an All IP Network"; 3 GPP TR 23.922, Version 1.0.0, Oct. 1, 1999; pp. 1–68.

"Diameter Mobile IP Extensions"; Internet Draft, Oct. 1999, pp. 1–33.

"Service Trading for Mobile Agents with LDAP as Service Directory"; by Park et al.; IEEE 1998, 0–8186–8751; Jul. 1998; pp. 270–275.

"Mobile IP"; Internet Article, 'Online,',; Jul. 13, 1999, pp. 1–63.

* cited by examiner

APPARATUS AND METHOD FOR FORMING SINGLE CRYSTALLINE NITRIDE SUBSTRATE USING HYDRIDE VAPOR PHASE EPITAXY AND LASER BEAM

TECHNICAL FIELD

The present invention relates to an apparatus and a method for making a single crystalline nitride substrate; and, more particularly, to an apparatus and a method for preventing cracks from being generated in a single crystalline nitride substrate.

BACKGROUND ART

A GaN single crystalline substrate, as an example of a single crystalline nitride substrate, will be described. Generally, the GaN materials has a melting point more than of 2400 and the dissociation pressure of nitride in the GaN materials is about ten thousand atmospheres. Accordingly, this high melting point and high dissociation pressure make it impossible to create a large single crystalline GaN bulk using typical growing methods of the semiconductor crystals. A needle-shaped crystal growing method, in which a gallium gas directly reacts on an ammonia gas at a high temperature of about 1000° C. to 1150° C., and a plate-shaped crystal growing method, in which nitrogen is dissolved in liquid gallium at a high temperature of about 1500° C. to 1600° C. and at a high nitrogen pressure corresponding to about 20000 atmospheres has been used to create a single crystalline GaN bulk (hereinafter, referred to as a GaN bulk).

However, these crystal growth methods have made a small-sized GaN bulk which has only a few millimeters in size and about 100μm in thickness. Accordingly, it is impossible to achieve a commercial success in using the GaN bulk.

To solve the above problem, a hydride vapor phase epitaxy has been used to create the GaN bulk at a growing rate of 100μm/hour. That is, after forming a thick GaN film on a parent substrate, such as sapphire or SiC substrate, the parent substrate is removed and then the GaN bulk is finally formed.

The removal of the parent substrate is carried out by the mechanical polishing method or laser beam. In particular to laser, as shown in FIG. 1, after forming the thick GaN film on the parent substrate at a high temperature of about 1000° C. to 1100° C., the thick GaN film on the parent substrate is cooled down to a room temperature. After increasing the temperature of the parent substrate up to about 600° C., the thick GaN film is separated from the parent substrate using laser beam in an additional apparatus different from the hydride vapor phase epitaxy ("Large free-standing GaN substrate by hydride vapor phase epitaxy and laser induced lift-off," by K. Kelly et al, Jpn. J. Appl. Phys. Vol. 38, No. 3A (pt 2), 1999).

In the above-mentioned hydride vapor phase epitaxy, since the thick GaN film is formed on the sapphire substrate at a high temperature and it is cooled down to the room temperature, cracks are generated by the lattice mismatch and thermal expansion coefficients between the GaN film and the sapphire substrate. Because of these cracks, the GaN bulk is restricted within a small-sized substrate and electric characteristics therein are also deteriorated.

DISCLOSURE OF INVENTION

It is, therefore, an object of the present invention to provide an apparatus and a method for preventing cracks from being generated in a single crystalline nitride substrate which is made by a hydride vapor phase epitaxy method.

Another object of the present invention is to provide an apparatus and a method for forming a large single crystalline nitride substrate on a commercial basis.

In accordance with an aspect of the present invention, there is provided an apparatus for forming a compound semiconductor substrate, the apparatus comprising: a reacting chamber for forming a single crystalline film on a parent substrate; a heating chamber connected to the reacting chamber within a processing channel, wherein the single crystalline film is separated from the parent substrate at a higher temperature than a room temperature; and a supporter for supporting the single crystalline film and the parent substrate and maintaining the single crystalline film in a predetermined temperature.

In accordance with another aspect of the present invention, there is provided a method for forming a compound semiconductor substrate, the method comprising the steps of: a) preparing a parent substrate; b) forming a single crystalline film on the parent substrate in a reacting chamber; c) maintaining the single crystalline film in a predetermined temperature which is higher than a room temperature; and d) illuminating laser beam on a backside of the parent substrate and separating the single crystalline film from the parent substrate.

According to the present invention, a thick GaN film is formed on a parent substrate, such as sapphire ($Al_2O_3$), spinel ($MgAl_2O_4$) or silicon carbide (SiC), which has the lattice mismatch with the single crystalline GaN film and a different thermal expansion coefficient, and the parent substrate is heated up to a range of 600° C. to 1000° C. In this temperature range, the single crystalline GaN film is separated from the parent substrate by laser beam.

BRIEF DESCRIPTION OF DRAWINGS

The above and other objects and features of the present invention will become apparent from the following description of preferred embodiments taken in conjunction with the accompanying drawings, in which.

BEST MODE FOR CARRYING OUT THE INVENTION

Figure 1:
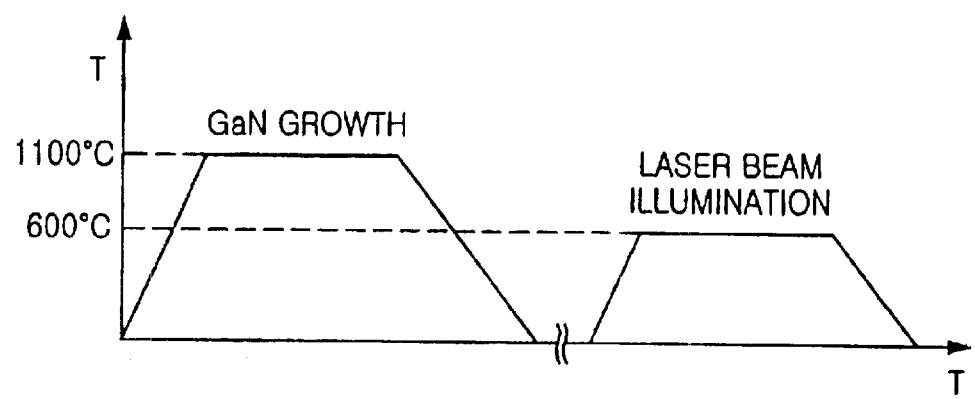
FIG. 1 is a plot illustrating a temperature variation in a conventional method for forming a single crystalline nitride substrate.
Figure 2:
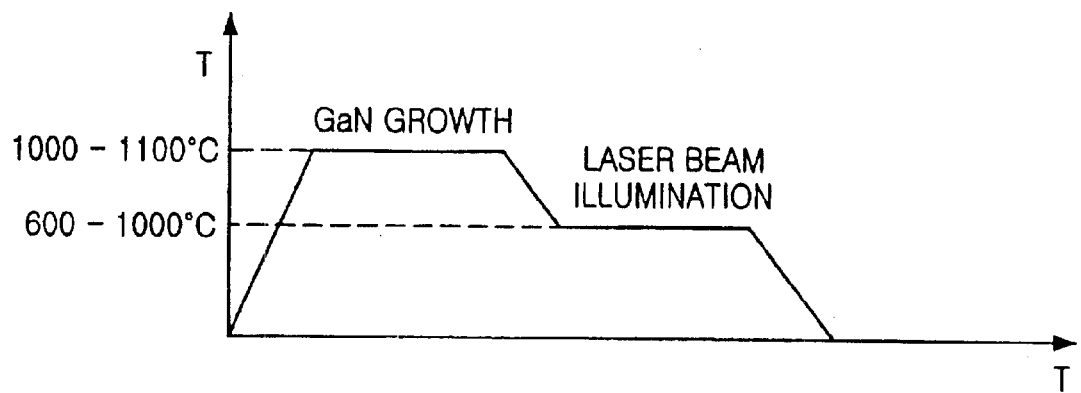
FIG. 2 is a plot illustrating a temperature variation in a method for forming a single crystalline nitride substrate according to the present invention.
Figure 3:
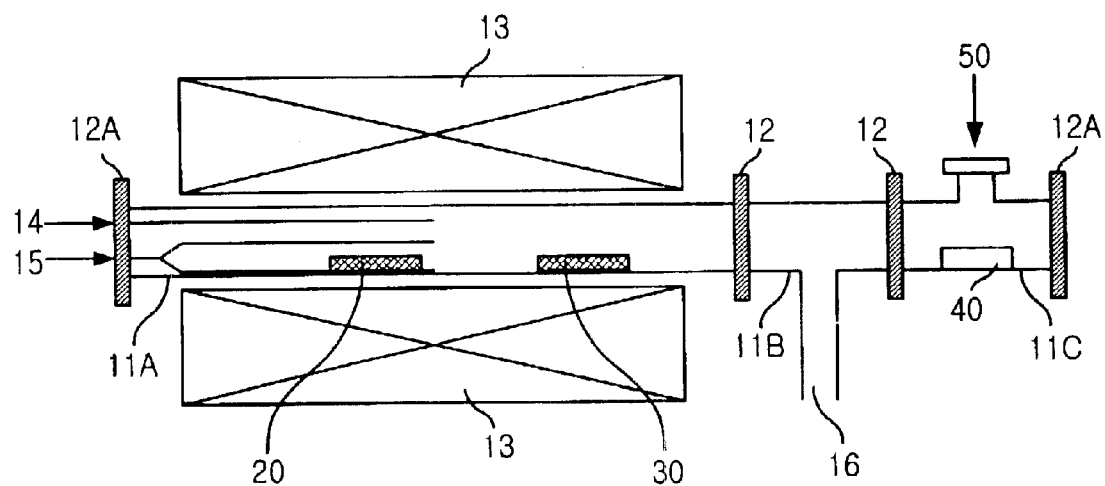
FIG. 3 is a schematic cross-sectional view of an apparatus for forming a single crystalline nitride substrate according to the present invention.

Referring to FIG. 3, a horizontal type hydride vapor phase epitaxy apparatus of an atmospheric pressure is shown in order to form a single crystalline nitride substrate. The hydride vapor phase epitaxy apparatus includes a reacting chamber 11A in which a quartz boat (not shown), is placed, a heating chamber 11C having a supporter 40 to maintain a specimen, and an exhausting chamber 11B positioned between the reacting chamber 11A and the heating chamber 11C and coupled to an exhausting system 16. The temperature of the supporter 40 in the heating chamber 11C is maintained in a specific temperature range and laser beam illumination to separate a single crystalline nitride film from a parent substrate 30 is carried out in the heating chamber 11C. Further, each of the chambers 11A to 11C adjacent to the exhausting chamber 11B is sealed up with shutters 12 and flanges 12A are mounted on both ends of the chambers 11A and 11C. Conventional mechanisms may be used to position and move specimens and quartz boats in the chambers.

The reacting chamber 11A is surrounded by a multi-step electric furnace 13 and is connected to a first inlet 14 to supply an ammonia gas and a second inlet 15 to supply hydrochloric acid and nitrogen gases. These gases react on Ga materials 20 within the reacting chamber 11A and then a thick GaN film is deposited on the parent substrate 30 adjacent to the Ga materials 20. While the thick GaN film is grown in the reacting chamber 11A, the reacting gases are purged away through the exhausting system 16 in the exhausting chamber 11B and when the growth of the single crystalline nitride substrate (the think GaN film) has been finished, the reacting chamber 11A is isolated from the exhausting chamber 11B by the shatter 12. The parent substrate 30 on which the thick GaN film is formed is removed onto the supporter 40 in the heating chamber 11C without being exposing to air and laser beam is illuminated on the backside of the parent substrate 30 at a temperature of about 600° C. to 1000° C. to separate a single crystalline GaN film (think GaN film) from the parent substrate 30. It should be noted that the thick GaN film and the parent substrate 30 are not cooled down to a room temperature.

Although the exhausting chamber 11B, as shown in FIG. 3, is positioned between the reacting chamber 11A and the heating chamber 11C, the reacting chamber 11A may be adjacent to the heating chamber 11C and the exhausting system 16 may be directly connected to the reacting chamber 11A.

The hydride vapor phase epitaxy apparatus shown in FIG. 3 may be used to form group III-N (nitrogen) compounds of single crystalline substrates, such as AlN, InN, GaInN, AlInN and AlGaInN, as well as the GaN single crystalline substrate, containers having Ga and In materials may be provided in the reacting chamber 11A and the hydrochloric acid and nitrogen gases flow into the reacting chamber 11A. FIGS. 4A to 4D illustrate a method for forming the GaN single crystalline substrate.

Figure 4A:
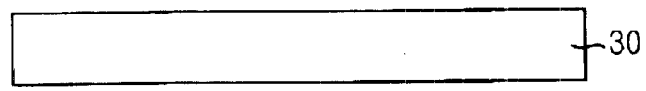
FIGS. 4A to 4D are schematic cross-sectional views illustrating a method for forming a single crystalline nitride substrate according to the present invention.

First, referring to FIG. 4A, the parent substrate 30 selected from one of an oxide substrate, such as sapphire ($Al_2O_3$) or spinel ($MgAl_2O_4$), and a silicon carbide substrate, such as SiC, is prepared and generally these parent substrates may have the lattice mismatch with the GaN materials and a different thermal expansion coefficient.

Figure 4B:
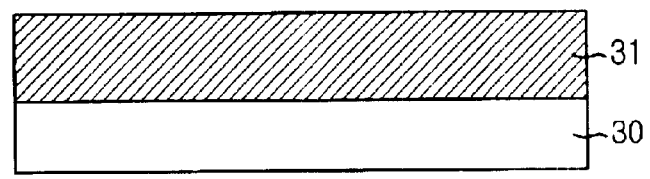

Next, referring to FIG. 4B, the thick GaN film 31 is formed on the parent substrate 30 in the hydride vapor phase epitaxy apparatus, as shown in FIG. 3, having the quartz boat in its reacting chamber 11A and the supporter 40 in its heating chamber 11C. The group III elements such as Ga are positioned at a region which is maintained at a temperature of about 600° C. to 900° C. by the multi-step electric furnace 13. At this time, the parent substrate is maintained at a temperature of about 1000° C. to 1100° C. The reacting chamber 11A in which the quartz boat is placed is pumped out up to about 10–3 torr, the reacting chamber 11A is gradually heated, and then the nitrogen gas injection into the reacting chamber 11A starts from about 600° C. When the reacting chamber 11A reaches to a temperature at which the thick GaN film is to be grown, the hydrochloric acid gas flows onto the Ga materials in the quartz boat and the ammonia gas is provided to the parent substrate 30 to form the thick GaN film 31 on the parent substrate 30 at a thickness of about 100$\mu$m to 550$\mu$m.

After forming the thick GaN film 31 on the parent substrate 30, the supply of the hydrochloric acid gas is broken off and the parent substrate 30 on which the thick GaN film 31 is formed is cooled with the supply of nitrogen and the ammonia gases until the temperature of the thick GaN film 31 reaches to a predetermined temperature range, e.g., about 600° C. to 1000° C.

Figure 4C:
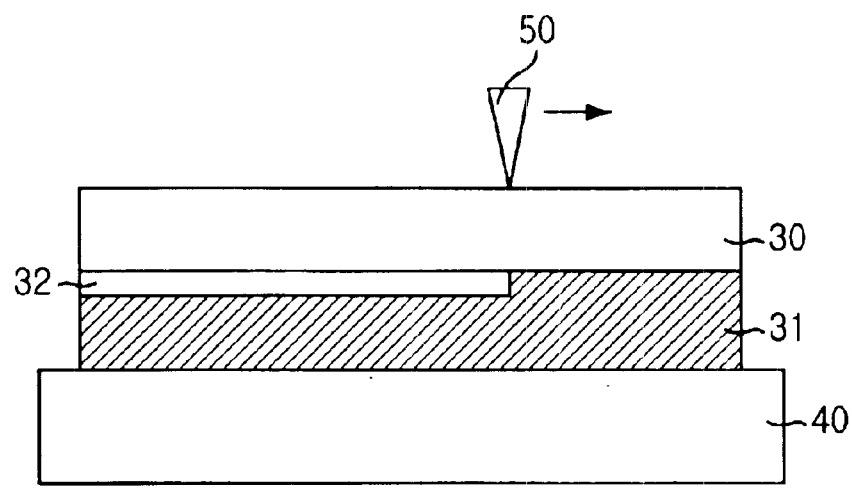

Referring to FIG. 4C, when the temperature of the reacting chamber 11A reaches to 600° C. to 1000° C., the parent substrate 30 on which the thick GaN film 31 is formed is moved into the supporter 40 in the heating chamber 11C. At this time, the temperature of supporter 40 is maintained at about 600° C. to 1000° C. and the bottom of the parent substrate 30 is turned over top so that the thick GaN film 31 is directly on the supporter 40. The turned upside of the parent substrate 30 is illuminated by laser beam (50). It should be noted that the thick GaN film 331 and the parent substrate 30 are not cooled down to a room temperature.

Figure 4D:
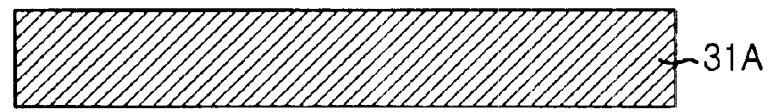

Referring to FIG. 4D, the parent substrate 30 is separated from the thick GaN film 31 by the high power laser beam. Nd:YAG laser beam, which has wavelength of 355 nm, power of about 500 mJ, pulse period of 10 to 20 Hz and pulse width of 5 to 6 ns, may be used. When this high power laser beam is illuminated on the parent substrate 30, the beam passes through the parent substrate 30 and is absorbed into the thick GaN film 31. If the thick GaN film 31 absorbs the high power laser beam, the GaN material, which is in a range of a few micrometers in thickness (dissolution area 32), are dissolved into gallium and nitrogen and the thick GaN film 31 is separated from the parent substrate 30 by this dissolution of the thick GaN film 31.

Since the single crystalline GaN substrate (the separated thick GaN film 31A has an uneven surface, the mechanical and chemical polishing using a diamond slurry is applied to the single crystalline GaN substrate 31A.

As apparent from the above, the present invention provides a high growing rate of the single crystalline nitride substrate without cracks caused by the lattice mismatch between other materials, by using the hydride vapor phase epitaxy method. Furthermore, the present invention provides stability and reliability of processing by effectively separating the single crystalline nitride substrate from the parent substrate by laser beam.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a nitrogen compound semiconductor substrate, the method comprising the steps of:
    a) preparing a parent substrate;
    b) forming a single crystalline nitride film on the parent substrate in a reacting chamber;
    c) moving the parent substrate on which the single crystalline nitride film is formed into a heating chamber that is connected to the reacting;
    d) moving onto a supporter the parent substrate, wherein the supporter is positioned in the heating chamber;
    e) heating the parent substrate up to a predetermined temperature which is higher than a room temperature; and f) while the single crystalline nitride film is at about the predetermined temperature that is higher than the room temperature, illuminating a laser beam on a backside of the parent substrate and separating the single crystalline nitride film from the parent substrate.

2. The method as recited in claim 1, wherein the parent substrate is selected from one of sapphire ($Al_2O_3$), spinet ($MgAl_2O_4$) or silicon carbide (SiC).

3. The method as recited in claim 1, wherein the single crystalline nitride film is formed by a hydride vapor phase epitaxy.

4. The method as recited in claim 1, wherein the step b) comprises the steps of:

a1) positioning a material selected from a group III at a first temperature region of 600° C. to 900° C. in the reacting chamber and positioning the parent substrate at a second temperature region of 1000° C. to 1100° C. in the reacting chamber;

a2) injecting a nitrogen gas into the reacting chamber;

a3) injecting a hydrochloric acid gas into the reacting chamber; and a4) injecting an ammonia gas into the reacting chamber.

5. The method as recited in claim 1, wherein the parent substrate is heated up to 600° C. to 1000° C.

6. The method as recited in claim 1, wherein the an exhausting chamber is positioned between the reacting chamber and the heating chamber, and wherein the reacting, exhausting and heating chambers are isolated are from each other by shutters.

* * * * *

UNITED STATES PATENT AND TRADEMARK OFFICE
CERTIFICATE OF CORRECTION

PATENT NO. : 6,750,121 B1
DATED : June 15, 2004
INVENTOR(S) : Bong-Cheol Kim

It is certified that error appears in the above-identified patent and that said Letters Patent is hereby corrected as shown below:

Title page,
Item [73], Assignee, "Protech Inc. (KR)" should read -- Prowtech Inc. (KR) --

Signed and Sealed this

Eighteenth Day of January, 2005

JON W. DUDAS
*Director of the United States Patent and Trademark Office*